United States Patent
Ten Pierick et al.

(10) Patent No.: US 6,861,875 B2
(45) Date of Patent: Mar. 1, 2005

(54) COMBINATION OF A CONTROL UNIT AND A LOGIC APPLICATION, IN WHICH THE COMBINATION IS CONNECTED TO A SYSTEM CLOCK

(75) Inventors: Hendrik Ten Pierick, Eindhoven (NL); Friedrich Hahn, Schenefeld (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 124 days.

(21) Appl. No.: 10/317,386

(22) Filed: Dec. 12, 2002

(65) Prior Publication Data

US 2003/0155956 A1 Aug. 21, 2003

(30) Foreign Application Priority Data

Dec. 18, 2001 (EP) .............................................. 01204954

(51) Int. Cl.⁷ .............................................. H03K 19/00
(52) U.S. Cl. ......................................................... 326/93
(58) Field of Search ........................ 326/26, 27, 93–98, 326/112, 119, 121

(56) References Cited

U.S. PATENT DOCUMENTS

| | | | | |
|---|---|---|---|---|
| 5,557,620 A | * | 9/1996 | Miller et al. ................. | 714/733 |
| 5,867,036 A | * | 2/1999 | Rajsuman ..................... | 326/16 |
| 6,320,418 B1 | * | 11/2001 | Fujii et al. .................... | 326/93 |
| 6,611,920 B1 | * | 8/2003 | Fletcher et al. ............. | 713/322 |

* cited by examiner

*Primary Examiner*—Don Le
(74) *Attorney, Agent, or Firm*—Aaron Waxler

(57) ABSTRACT

The invention relates to a system (2) of a control unit (4) and a logic application (6), wherein the control unit (4) and the logic application (6) are connected to a system clock, wherein the logic application (6) comprises a series connection (16) of logic elements (18), wherein, in use, the system clock generates a clock signal (8) and feeds this clock signal to the control unit (4) and the logic application (6), and wherein the control unit (4) controls the supply voltage of the series connection (16) on the basis of the clock signal (8) such that the delay time of the series connection (16) is substantially equal to a predetermined value.

7 Claims, 2 Drawing Sheets

COMBINATION OF A CONTROL UNIT AND A LOGIC APPLICATION, IN WHICH THE COMBINATION IS CONNECTED TO A SYSTEM CLOCK

TECHNICAL FIELD

The invention relates to a system of a control unit and a logic application for clocking the logic application on the basis of a clock signal.

RELATED ART

Logic applications, such as, for example, ripple counters, comprise one or more clocked series connections of logic elements. The number of logic elements in a series connection is called the logical depth of the series connection. A signal can be fed to the series connection, the logic elements carrying out one or more operations to the signal fed. In doing so, the logic elements function, among other things, as delay elements.

Each of the logic elements in the series connection is connected, whether or not direct, to a system clock, which can generate a clock signal. The clock signal usually consists of a series of clock pulses. The time between the clock pulses is the clock period. The operations carried out by the logic elements of the series connection are started at a clock pulse and should be completed before the next clock pulse is generated. The total time needed for the operations of the logic elements is the delay time of the series connection. This delay time must always be shorter than the clock period. The difference between the clock period and the delay time is the margin time.

The delay time of a series connection of elements is substantially equal to the sum of the delay times of the individual logic elements in the series connection. The delay time of a logic element mainly depends on three factors. These three factors are: the process spread, the temperature, and the supply voltage fed to the logic element. Process spread means that the delay times of individual logic elements of the same type may vary as a result of statistical variations that have taken place during the production process. Furthermore, it may be noted that the delay time of the logic elements increases with an increasing temperature. Finally, the delay time of a logic element increases as the supply voltage of the element decreases.

A drawback of known logic applications is that the delay times of the clocked series connections of these logic applications show relatively great differences from one product to another. It may happen, for example, that a series connection of one logic application has a delay time of 40% of the clock period at a certain supply voltage and a certain temperature, whereas an identical series connection of another logic application has a delay time of 90% of the clock period. When designing the applications, it is therefore necessary to allow for a worst-case scenario. In this worst-case scenario, the margin time must be even greater than a certain minimum. The worst-case scenario is defined by the slowest ("process=slow") product of the logic application concerned, under the condition of a maximum operational temperature and a minimum operational supply voltage. The consequence of said working method is that some series connections of certain logic applications have needlessly great margin times. Consequently, the processing speed of signals is needlessly high, and the series connections operate at a relatively high supply voltage. The effect of this relatively high supply voltage is that the risk of breakdown is relatively great, due to the fact that relatively strong interference signals are generated. Another adverse effect is that the energy consumption will be relatively high.

SUMMARY OF THE INVENTION

It is an object of the invention to eliminate the aforementioned drawbacks. To this end, the invention provides a system of a control unit and a logic application, wherein the control unit and the logic application can be connected to a system clock, wherein the logic application comprises a series connection of logic elements, wherein, in use, the system clock generates a clock signal and feeds this to the control unit and the series connection of the logic application, and wherein the control unit controls a first supply voltage for the series connection on the basis of the clock signal in such a way that the delay time of the series connection is at least substantially equal to a predetermined value. In this way, the control unit can control the delay time in such a way that it approaches the clock period as closely as possible, subject to a predetermined margin time. Because of the worst-case design method discussed above, the delay value of the series connection of most prior art logic applications is considerably shorter than the clock period under operational conditions. The control unit can reduce the first supply voltage for these logic applications, thus reducing the energy consumption of the applications and the risk of generating interference signals (spikes).

In an embodiment of the system according to the invention, the control unit comprises a first series connection of logic elements for emulating the series connection of the logic application, wherein the series connection and the first series connection are placed close to each other, and wherein, in use, the control unit controls the first supply voltage in dependence on the temperature of the first series connection. At the same time, the control unit controls the delay time by adjusting the first supply voltage in dependence upon the temperature. The series connection and the first series connection preferably have the same delay behavior. The series connection and the first series connection have, at least approximately, the same temperature, because they are placed close to each other. As a result, the behavior of the series connection can be emulated by the control unit by means of the first series connection. In this way, the control unit can control the first supply voltage of the first series connection on the basis of the emulation behavior of the second series connection.

A more detailed embodiment is characterized in that a logical depth of the first series connection is greater than a logical depth of the series connection of the logic application, wherein the first series connection of logic elements can generate a delayed clock signal on the basis of the clock signal, and the control unit also comprises a reference unit for generating a time-difference signal on the basis of the clock signal and the delayed clock signal, which time-difference signal corresponds to a delay of the delayed clock signal with respect to the clock signal, and the control unit further comprises a control element for controlling the first supply voltage on the basis of the time-difference signal, while, in use, the first supply voltage is fed to the logic elements of the first series connection. The first series connection is preferably chosen in such a way that it has the same delay characteristic as the series connection. This can be achieved, for example, by selecting the logic elements of the connections from the same library. Furthermore, the two connections are preferably placed close to each other in such a way that they have, at least approximately, the same temperature. Since the logical depth of the first series connection is greater than the logical depth of the series connection, the delay time of the first series connection is greater than the delay time of the series connection. In this way, the control element can control the first supply voltage in such a way that the delay of the delayed clock signal with respect to the clock signal is substantially equal to a clock period of the clock signal, while a sufficiently large margin time is realized for the series connection. In this case, the exact margin time for the series connection is determined by the difference in logical depth of the connections, the temperature, and the afore-mentioned specific "process" properties of the connections.

BRIEF DESCRIPTION OF THE DRAWINGS

The invention will now be explained in more detail with reference to the drawing, in which.

DETAILED DESCRIPTION OF THE INVENTION

Figure 1:
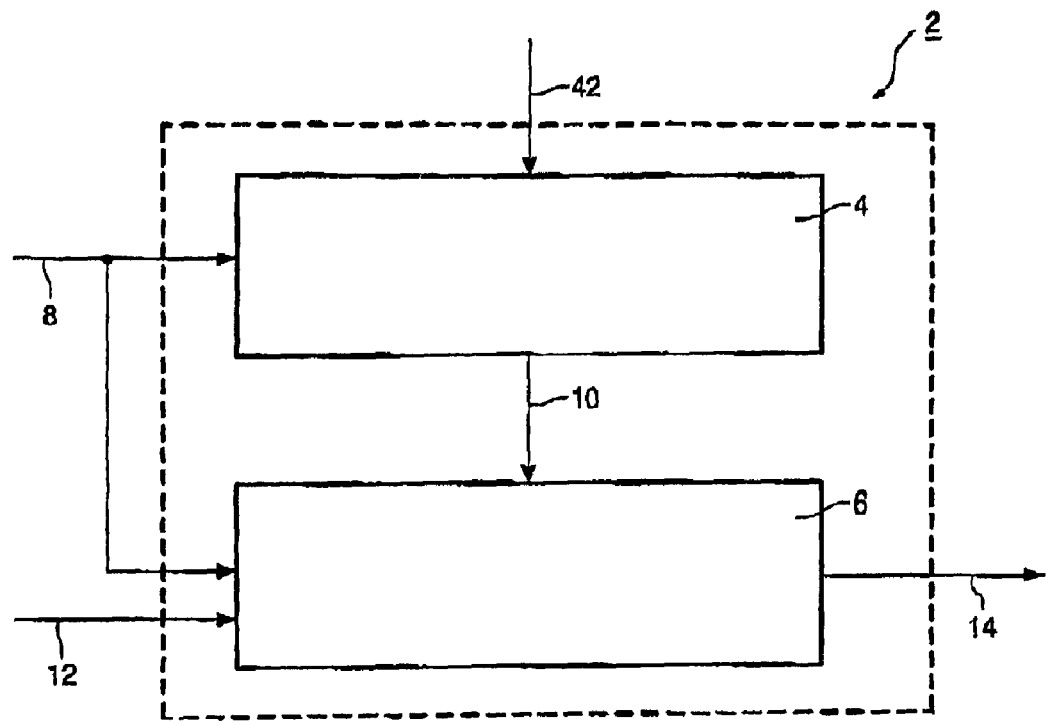
FIG. 1 diagrammatically shows a system of a control unit and a logic application according to the invention.
Figure 2:
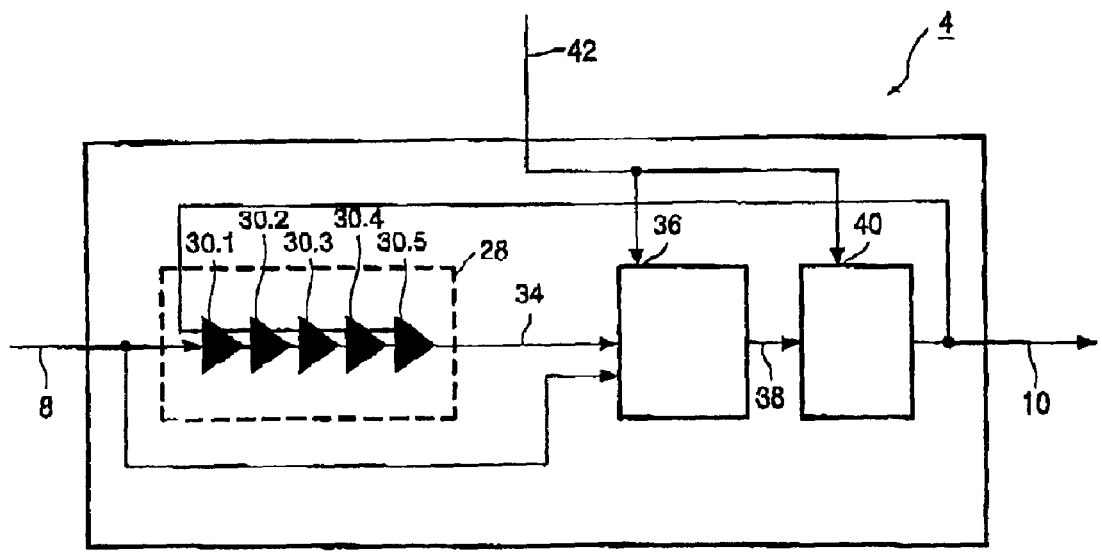
FIG. 2 diagrammatically shows a control unit of the system of FIG. 1.

FIG. 1 diagrammatically shows a system 2 of a control unit 4 and a logic application 6. The control unit 4 and the logic application 6 are connected to a system clock, which generates a clock signal 8 and feeds this to the control unit 4 and the logic application 6. The control unit 4 can control a first supply voltage 10 for the logic application 6 on the basis of the clock signal 8. The controlled first supply voltage 10 is fed to the logic application 6. Furthermore, an input signal 12 can be fed to the logic application. The logic application 6 can generate an output signal 14 on the basis of the clock signal 8 and the input signal 12. The logic application 6 can, for example, be a clocked "ripple counter".

Figure 3:
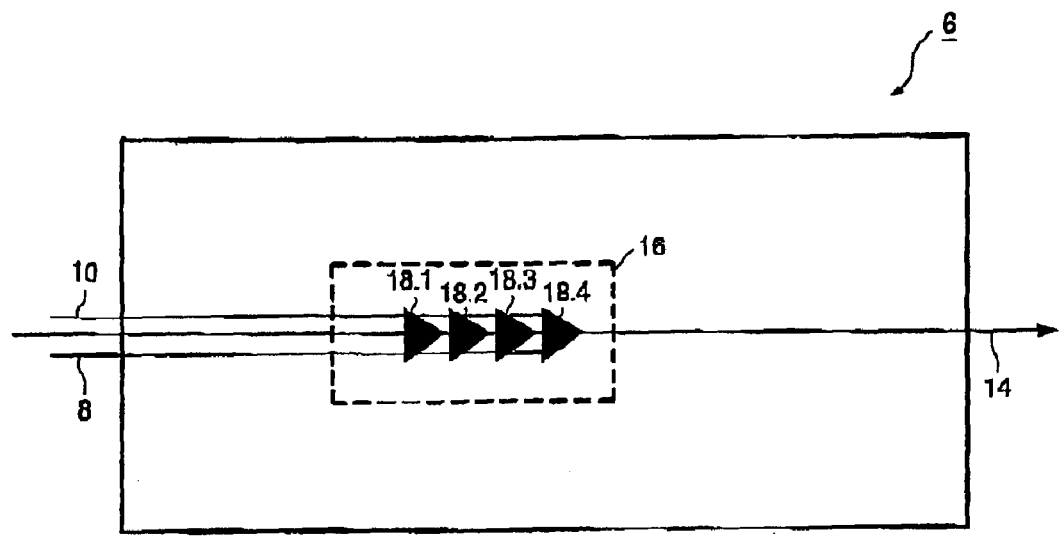
FIG. 3 diagrammatically shows a logic application of the system of FIG. 1.
Figure 4:
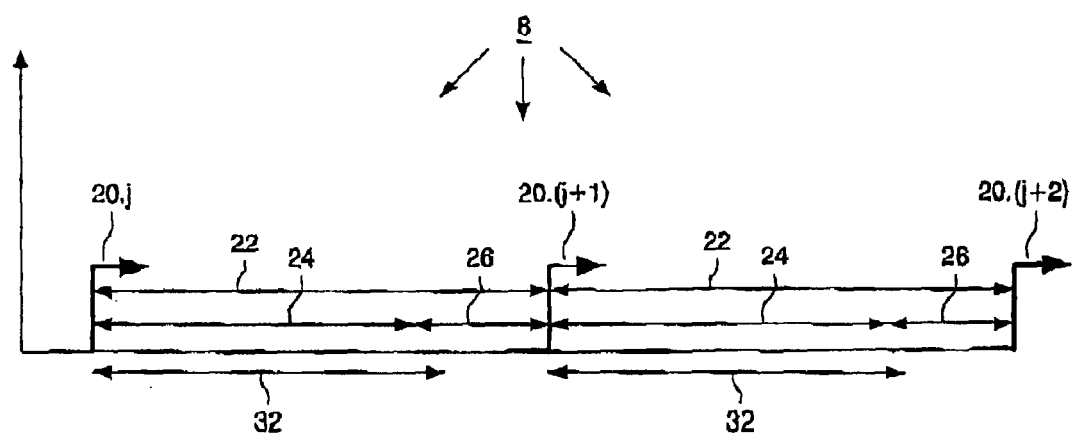
FIG. 4 diagrammatically shows a time axis with a clock signal of a system clock, delay time, and margin time of a logic application.

In this example, the logic application 6 comprises a series connection 16 of logic elements 18.1 to 18.4 (if necessary, see FIG. 3). A clock signal 8 can be fed to each of the logic elements 18.i (i=1, . . . ,4) in the series connection 16. In this example, the clock signal 8 consists of a series of clock pulses 20.j, (j=1, . . . ,J) (j and J are integers). The time between consecutive clock pulses 20.j, (j=1, . . . ,J) is the clock period T 22. The operations carried out by the logic elements 18. i (i=1, . . . ,4) of the series connection 16 are started at a clock pulse 20.j, and should be completed before the clock pulse 20.(j+1) is generated. The total time needed for the operations of the logic elements 18.i (i=1, . . . ,4) is the delay time D 24 of the series connection 16. This delay time D 24 must be shorter than the clock period T 22. The difference between the clock period T 22 and the delay time D 24 is the margin time M 26.

In this embodiment, the control unit 4 feeds the first supply voltage 10 to the series connection 16 of the logic application 6. The control unit 4 can control the first supply voltage 10 on the basis of the clock signal 8 in such a way that the delay time D 24 of the series connection 16 is, at least substantially, equal to a predetermined value.

The control unit 4 comprises a first series connection 28 of logic elements 30.k (k=1, . . . ,5) for emulating the series connection. The first series connection 28 has a delay time 32, which is used by the control unit 4 for controlling the first supply voltage 10.

In this example, the logical depth of the series connection 16 is equal to 4, and the logical depth of the first series connection 28 is equal to 5. The logical depth of the first series connection 28 is therefore greater than the logical depth of the series connection 16. As a result, the delay time emulated with the first series connection 28 is greater than or equal to the delay time 24 of the series connection 16. Thus, a safety margin is obtained for the control process of the control unit 4, so that the controlled delay time D 24 does not become greater than the clock period T 22 during controlling.

To obtain a reliable emulation of the series connection 16 by the first series connection 28, it is desirable for both series connections to exhibit the same delay behavior. This can be realized, for example, by ensuring that the logic elements of the series connections come from the same library. Furthermore, it is desirable that the series connections 16 and 28 have the same temperature. To achieve this, the series connections 16 and 28 are placed close to each other so as to conduct heat. In this way, the control unit 4 can control the first supply voltage 10 in dependence on the temperature of the series connection 16 (indirect) and the first series connection 28 (direct). This may take place by keeping the delay of the first series connection 28 constant.

The first series connection 28 can generate a delayed clock signal 34 on the basis of the clock signal 8, the delay being equal to the delay value 32. Subsequently, the delayed clock signal 34 can be compared with the clock signal 8 by a reference unit 36. The reference unit 36 may, for example, be a phase detector. The reference unit can generate a time-difference signal 38 on the basis of the clock signal 8 and the delayed clock signal 34. The time-difference signal 38 corresponds to the delay time 32 of the delayed clock signal 34 with respect to the clock signal 8. Furthermore, the control unit 4 comprises a control element 40 for controlling the first supply voltage 10 on the basis of the time-difference signal 38.

If the logical depth of the first series connection 28 is so much greater than the logical depth of the series connection 16 (this could mean that in such cases the difference in logical depth should be more than 1 logic element) that the said safety margin is sufficiently great, the control element 4 can then control the first supply voltage 10 in such a way that the delay value 32 of the delayed clock signal 34 with respect to the clock signal 8 is substantially equal to clock period T 22 of the clock signal 8. An effective control unit 4 is thus realized in a simple way.

The control unit 4 in this example is connected to a second supply voltage via a connection 42. Via the connection 42, the reference unit 36 and the control element 40 can be fed with the second supply voltage.

The invention was described above with reference to a possible embodiment of the system according to the invention. The invention is, however, by no means limited to this embodiment. It is, for example, conceivable for the logical depths of the series connection and the first series connection to be identical. In that case, the control element must control the supply voltage in such a way as to provide a sufficiently great margin time M.

What is claimed is:

1. A system (2) of a control unit (4) and a logic application (6), wherein the control unit (4) and the logic application (6) can be connected to a system clock, wherein the logic application (6) comprises a series connection (16) of logic elements (18), wherein, in use, the system clock generates a clock signal (8) and feeds this to the control unit (4) and the series connection (16) of the logic application (6), and wherein the control unit (4) controls a first supply voltage (10) for the series connection (16) on the basis of the clock signal (8) such that the delay time of the series connection (16) is at least substantially equal to a predetermined value.

2. A system as claimed in claim 1, characterized in that the control unit (4) comprises a first series connection (28) of logic elements (30) for emulating the series connection (16) of the logic application (6), and the series connection (16) and the first series connection (28) are placed close to each other, while, in use, the control unit (4) controls the first supply voltage (10) in dependence on the temperature of the first series connection (28).

3. A system as claimed in claim 2, characterized in that a logical depth of the first series connection (28) is greater than a logical depth of the series connection (16) of the logic application (6), wherein the first series connection (28) of logic elements (30) can generate a delayed clock signal (34) on the basis of the clock signal (8), and the control unit (4) also comprises a reference unit (36) for generating a time-difference signal (38) on the basis of the clock signal (8) and the delayed clock signal (34), which time-difference signal (38) corresponds to a delay of the delayed clock signal (34) with respect to the clock signal (8), and the control unit (4) further comprises a control element (40) for controlling the first supply voltage (10) on the basis of the time-difference signal (38), while, in use, the first supply voltage (10) is fed to the logic elements (30) of the first series connection (28).

4. A system as claimed in claim 3, characterized in that, in use, the control element (40) controls the first supply voltage (10) in such a way that the delay of the delayed clock signal (34) with respect to the clock signal (8) is substantially equal to a clock period of the clock signal.

5. A system as claimed in claim 3, characterized in that the first series connection (28) has substantially the same delay characteristic as the series connection (16).

6. A system as claimed in any one of the claim 3, characterized in that the reference unit (36) is a phase detector.

7. A system as claimed in any one of the claim 3, characterized in that, in use, the reference unit (36) and the control element (40) are fed with a second supply voltage.

* * * * *